(12) United States Patent
Lee

(10) Patent No.: US 7,339,155 B2
(45) Date of Patent: Mar. 4, 2008

(54) CMOS IMAGE SENSOR AND METHOD FOR FABRICATING THE SAME

(75) Inventor: Sang Gi Lee, Bucheon (KR)

(73) Assignee: Dongbu Electronics Co., Ltd, Seoul (KR)

( * ) Notice: Subject to any disclaimer, the term of this patent is extended or adjusted under 35 U.S.C. 154(b) by 49 days.

(21) Appl. No.: 11/320,767

(22) Filed: Dec. 30, 2005

(65) Prior Publication Data

US 2007/0063126 A1 Mar. 22, 2007

(30) Foreign Application Priority Data

Sep. 21, 2005 (KR) .................... 10-2005-0087603

(51) Int. Cl.
*H01L 27/00* (2006.01)
(52) U.S. Cl. .................... 250/214.1; 257/435; 438/72; 250/208.1
(58) Field of Classification Search ............ 250/208.1, 250/214.1; 257/435; 438/72, 65
See application file for complete search history.

(56) References Cited

U.S. PATENT DOCUMENTS

| | | | | |
|---|---|---|---|---|
| 4,667,092 A | * | 5/1987 | Ishihara ..................... 250/216 |
| 6,081,018 A | * | 6/2000 | Nakashiba et al. ......... 257/435 |
| 6,731,397 B1 | * | 5/2004 | Merrill et al. ............. 358/1.16 |
| 2003/0127667 A1 | * | 7/2003 | Inoue et al. ................ 257/229 |
| 2005/0056901 A1 | * | 3/2005 | Kuriyama ................... 257/428 |
| 2005/0236653 A1 | * | 10/2005 | Lim ........................... 257/294 |
| 2006/0046204 A1 | * | 3/2006 | Ono et al. .................. 430/321 |
| 2006/0197169 A1 | * | 9/2006 | Cole .......................... 257/431 |

* cited by examiner

*Primary Examiner*—John R. Lee
(74) *Attorney, Agent, or Firm*—McKenna Long & Aldridge LLP

(57) ABSTRACT

A CMOS image sensor and a method for fabricating the same are disclosed, in which light-shielding layers are formed in trenches to improve photosensitivity of the image sensor and simplify its process steps. The CMOS image sensor includes a plurality of photodiodes formed in a semiconductor substrate at constant intervals, an interlayer dielectric layer formed on the semiconductor substrate including the photodiodes, a plurality of metal lines formed in the interlayer dielectric layer, a plurality of light-shielding layers formed in the interlayer dielectric layer to correspond to the metal lines, and microlenses formed over the interlayer dielectric layer to correspond to portions between the respective light-shielding layers.

15 Claims, 5 Drawing Sheets

CMOS IMAGE SENSOR AND METHOD FOR FABRICATING THE SAME

CROSS-REFERENCE TO RELATED APPLICATION

This application claims the benefit of Korean Patent Application No. 10-2005-0087603, filed on Sep. 21, 2005, which is hereby incorporated by reference as if fully set forth herein.

BACKGROUND OF THE INVENTION

1. Field of the Invention

The present invention relates to an image sensor, and more particularly, a complementary metal-oxide semiconductor (CMOS) image sensor and a method for fabricating the same, in which light-shielding layers are formed in trenches to improve photosensitivity of the image sensor and simplify the process steps for manufacturing the CMOS image sensor.

2. Discussion of the Related Art

Generally, an image sensor is a semiconductor device that converts optical images to electrical signals. The image sensor is typically classified as a charge coupled device (CCD) image sensor or a CMOS image sensor.

The CMOS image sensor includes a photodiode area for sensing light and a CMOS logic circuit area for processing the sensed light to generate electrical signals. If amount of light received in the photodiode is great, the image sensor has excellent photosensitivity characteristics.

To enhance photosensitivity, a fill factor of an area occupied by the photodiode relative to the whole area of the image sensor can be increased. Alternatively, it is advantageous to change a path of incident light originally received by an area other than the photodiode so as to condense the light to the photodiode.

To condense light to the photodiode, a microlens is generally used. A convex microlens made of a material having good light transmittance is formed on the photodiode to refract incident light, thereby directing more light to the photodiode. In this case, light parallel to a light axis of the microlens is refracted by the microlens so that a focal point is formed on a certain position of the light axis.

Hereinafter, a conventional method for fabricating a CMOS image sensor will be described with reference to FIG. 1A to FIG. 1D.

As shown in FIG. 1A, a plurality of photodiodes 20 are formed in a surface of a semiconductor substrate 10 at constant intervals. Then, as shown in FIG. 1B, an interlayer dielectric layer 30 is formed on an entire surface of the semiconductor substrate 10, including the photodiodes 20, and a plurality of metal lines 32 are formed in the interlayer dielectric layer 30.

Next, an opaque metal layer is formed on the interlayer dielectric layer 30 and then selectively patterned by a photolithographic process to form light-shielding layers 40 that prevent light from entering an area other than the photodiodes 20. At this time, the light-shielding layers 40 are formed on portions corresponding to the metal lines 32.

As shown in FIG. 1C, a first planarization layer 50 is formed on the entire surface of the semiconductor substrate 10, including the light-shielding layers 40. Color filter layers 60 are formed on the first planarization layer 50 to correspond to the respective photodiodes 20.

The color filter layers 60 are comprised of red, green, and blue color filters. Each of the color filter layers 60 is formed in such a manner that a corresponding photoresist material is coated, and the photolithographic process is performed using a separate mask. The color filters are formed at constant intervals.

As shown in FIG. 1D, a second planarization layer 70 is formed on the entire surface of the semiconductor substrate 10, including the respective color filter layers 60. A material layer for microlenses is coated on the second planarization layer 70 and then patterned by exposing and developing processes to form a microlens pattern.

Finally, the microlens pattern undergoes a reflow process to form microlenses 80. The microlenses 80 condense incident light to the photodiodes 20 through the color filter layers 60 corresponding to the microlenses 80.

However, the conventional method for fabricating a CMOS image sensor has several problems.

When the light-shielding layers that prevent light from entering an area other than the photodiodes are conventionally formed by a patterning process, it is difficult to define a narrow area due to the resolution of the patterning process. If a narrow area is forcibly defined, problems such as particles may occur.

In addition, since the light-shielding layers are formed to be extended on the semiconductor substrate, the color filter layers are formed after the planarization layer is separately formed. In this case, the process steps are complicated, and the distance between the microlenses and the photodiodes increases, thereby deteriorating photosensitivity of the image sensor.

SUMMARY OF THE INVENTION

Accordingly, the present invention is directed to a CMOS image sensor and a method for fabricating the same that substantially obviates one or more problems due to limitations and disadvantages of the related art.

The present invention provides a CMOS image sensor and a method for fabricating the same in which light-shielding layers are formed in trenches to improve photosensitivity of the image sensor and simplify its process steps.

Additional advantages and features of the invention will be set forth in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages and in accordance, with the invention, as embodied and broadly described herein, a CMOS image sensor according to the present invention includes a plurality of photodiodes formed in a semiconductor substrate at constant intervals; an interlayer dielectric layer formed on the semiconductor substrate including the photodiodes; a plurality of metal lines formed in the interlayer dielectric layer; a plurality of light-shielding layers formed in the interlayer dielectric layer to correspond to the metal lines; and microlenses formed over the interlayer dielectric layer to correspond to portions between the respective light-shielding layers.

The light-shielding layers can be formed in a plurality of trenches formed in the interlayer dielectric layer to correspond to the metal lines.

The light-shielding layers can be black photoresist layers or opaque metal layers. The opaque metal layers can be Cr layers.

The photodiodes can include a plurality of red photodiodes, a plurality of green photodiodes, and a plurality of blue photodiodes, the red, green and blue photodiodes being sequentially and vertically arranged.

The CMOS image sensor can further include color filter layers formed on the interlayer dielectric layer to correspond to the respective photodiodes.

The CMOS image sensor can further include a planarization layer formed over the semiconductor substrate, including the color filter layers, wherein the microlenses are formed on the planarization layer to correspond to the portions between the respective light-shielding layers.

In another aspect of the present invention, a method for fabricating a CMOS image sensor includes forming a plurality of photodiodes in a semiconductor substrate at constant intervals; forming an interlayer dielectric layer on the semiconductor substrate, including the photodiodes; forming a plurality of metal lines in the interlayer dielectric layer; forming a plurality of light-shielding layers in the interlayer dielectric layer to correspond to the metal lines; and forming microlenses over the interlayer dielectric layer to correspond to portions between the respective light-shielding layers.

The step of forming the light-shielding layers can include forming a plurality of trenches in the interlayer dielectric layer to correspond to the metal lines; forming black photoresist layers or opaque metal layers on the entire surface of the semiconductor substrate including the trenches; and planarizing the black photoresist layers or the opaque metal layers to form the light-shielding layers in the trenches.

The black photoresist layers or the opaque metal layers can be planarized by a chemical mechanical polishing (CMP) process or an etch-back process.

The method can further include forming areas for the metal pad in the interlayer dielectric layer.

The trenches can be formed simultaneously with the areas for the metal pad using a mask used to form the areas for the metal pad.

The method further can include hardening the microlenses by irradiation of UV light.

The step of forming the photodiodes can include forming a plurality of red photodiodes in a first epitaxial layer grown on the semiconductor substrate; growing a second epitaxial layer on the first epitaxial layer, including the red photodiodes; forming a plurality of green photodiodes in the second epitaxial layer; growing a third epitaxial layer on the second epitaxial layer including the green photodiodes; and forming a plurality of blue photodiodes in the third epitaxial layer.

The method can further include forming a plurality of color filter layers on the interlayer dielectric layer to correspond to the respective photodiodes.

The method can further include forming a planarization layer over the semiconductor substrate, including the color filter layers, wherein the microlenses are formed on the planarization layer to correspond to the portions between the respective light-shielding layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate embodiments of the invention and together with the description serve to explain the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1A:
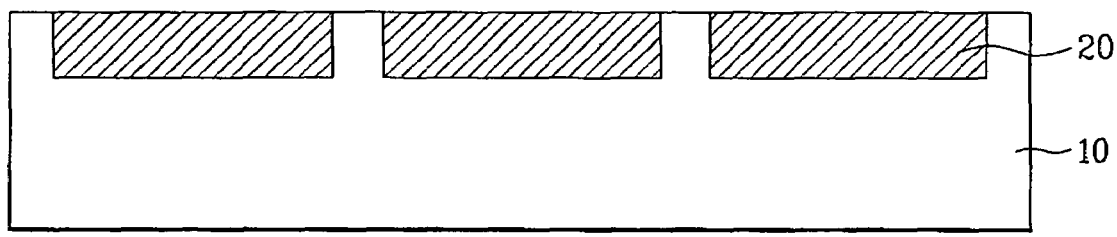
FIG. 1A to FIG. 1D are sectional views illustrating a related art method of fabricating a CMOS image sensor.
Figure 1B:
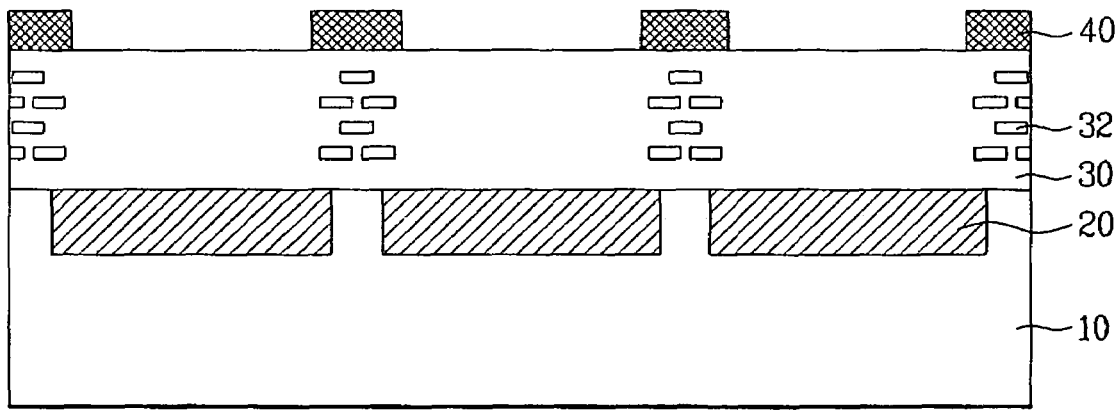
Figure 1C:
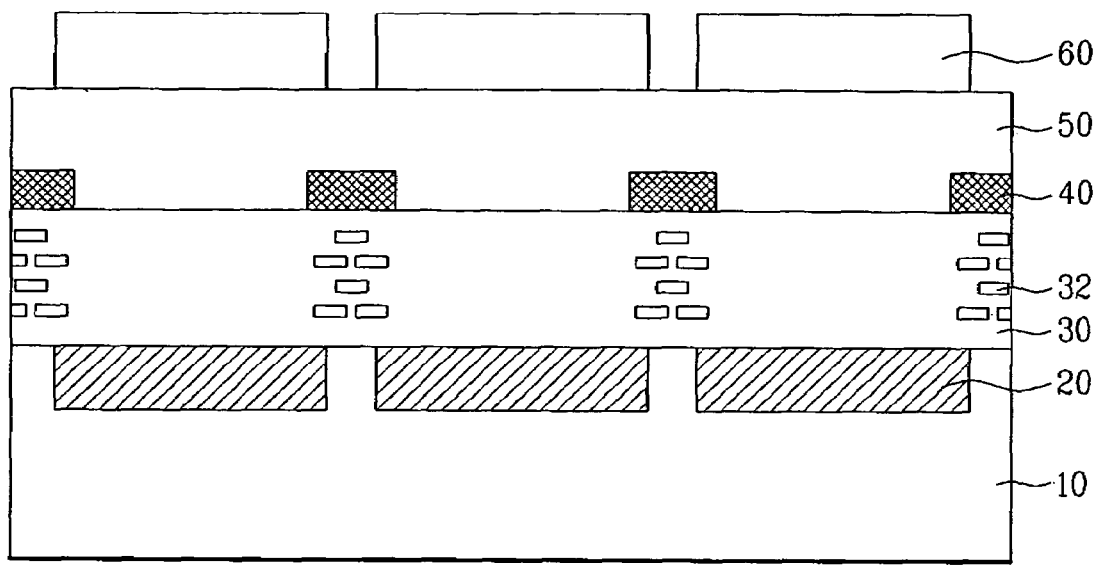
Figure 1D:
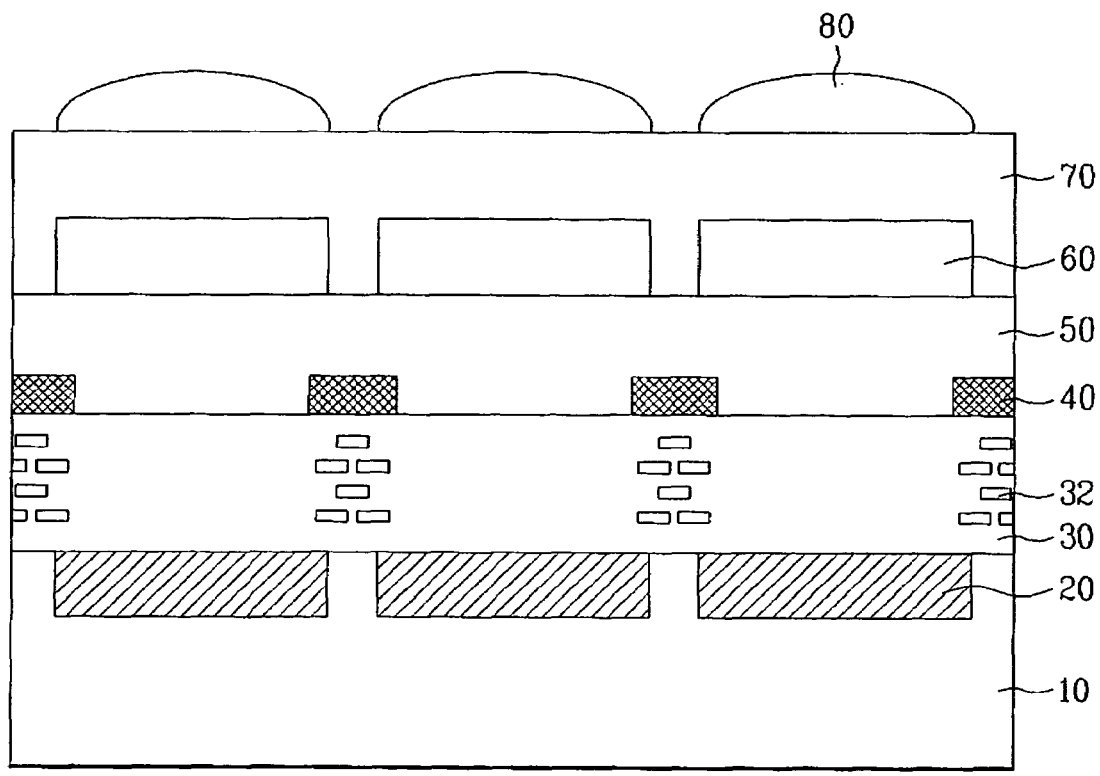
Figure 2:
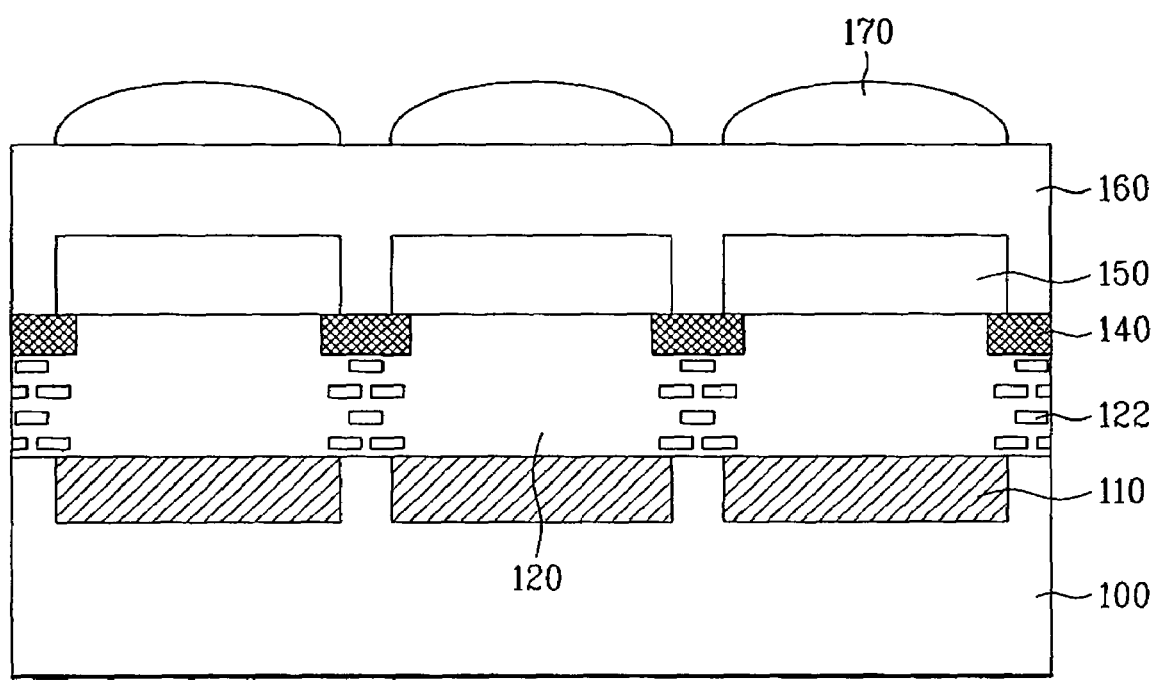
FIG. 2 is a sectional view illustrating an exemplary CMOS image sensor according to the present invention.

FIG. 2 is a sectional view illustrating the CMOS image sensor according to the present invention.

As shown in FIG. 2, the CMOS image sensor according to the present invention includes a plurality of photodiodes 110 formed in a surface of a semiconductor substrate 100 to generate charges in response to incident light; an interlayer dielectric layer 120 formed on an entire surface of the semiconductor substrate 100, including the photodiodes 110; a plurality of metal lines 122 formed in the interlayer dielectric layer 120; a plurality of light-shielding layers 140 formed in the interlayer dielectric layer 120 to correspond to the metal lines 122 and prevent light from entering a portion other than the photodiodes 110; red, green and blue color filter layers 150 formed on the interlayer dielectric layer 120 at constant intervals to allow both ends of each color filter layer to overlap the respective light-shielding layers 140; a planarization layer 160 formed on the entire surface of the semiconductor substrate 100, including the color filter layers 150; and microlenses 170 formed with a convex shape having a curvature on the planarization layer 160 that condenses the light through the color filter layers 150 to the photodiodes 110.

At this time, the microlenses 170 can be formed on the planarization layer 160 to correspond to portions between the respective light-shielding layers 140, thereby preventing a step difference from occurring in the light-shielding layers.

FIG. 3A to FIG. 3E are sectional views illustrating a method for fabricating the CMOS image sensor according to the present invention.

Figure 3A:
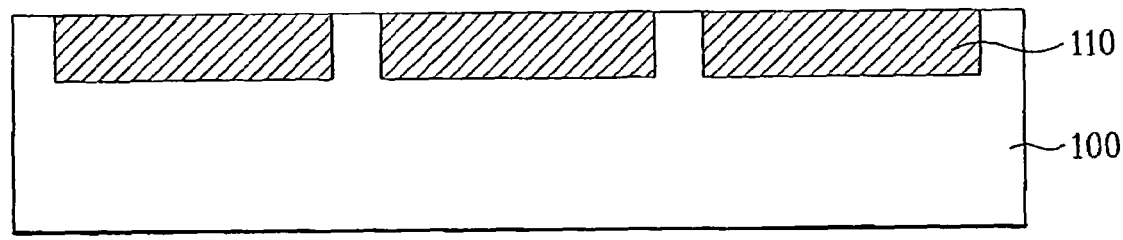
FIG. 3A to FIG. 3E are sectional views illustrating an exemplary method for fabricating a CMOS image sensor according to the present invention.
Figure 3B:
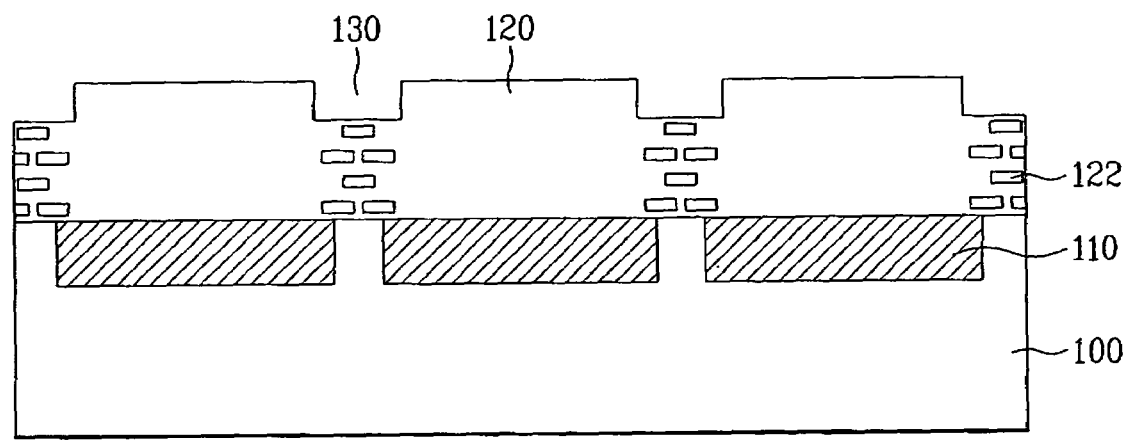

As shown in FIG. 3A, the plurality of photodiodes 110 are formed in the surface of the semiconductor substrate 100 at constant intervals. As shown in FIG. 3B, the interlayer dielectric layer 120 is formed on the entire surface of the semiconductor substrate 100, including the photodiodes 110. The plurality of metal lines 122 are formed in the interlayer dielectric layer 120. Either nitride or oxide such as undoped silicate glass (USG) can be used as the interlayer dielectric layer 120.

Subsequently, trenches 130 having a predetermined depth are formed in a surface of the interlayer dielectric layer 120 between the photodiodes 110 through a photolithographic process.

The trenches 130 can be formed using a photo mask used to form areas for the metal pad (not shown) on the semiconductor substrate 100. To simplify the process steps, the trenches 130 are formed simultaneously with the areas for the metal pad(not shown).

Figure 3C:
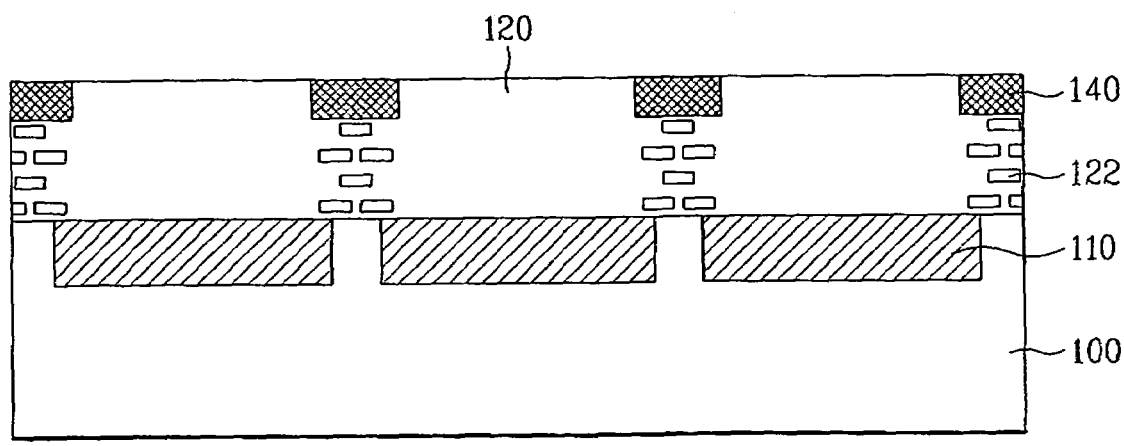

As shown in FIG. 3C, an opaque metal layer, such as a Cr layer, is deposited on the entire surface of the semiconductor substrate 100, including the trenches 130. Instead of the opaque metal layer, a black photoresist may be used.

Next, the light-shielding layers 140 are formed in the trenches 130 by performing a chemical mechanical polishing (CMP) process or an etch-back process on the entire surface of the opaque metal layer.

Figure 3D:
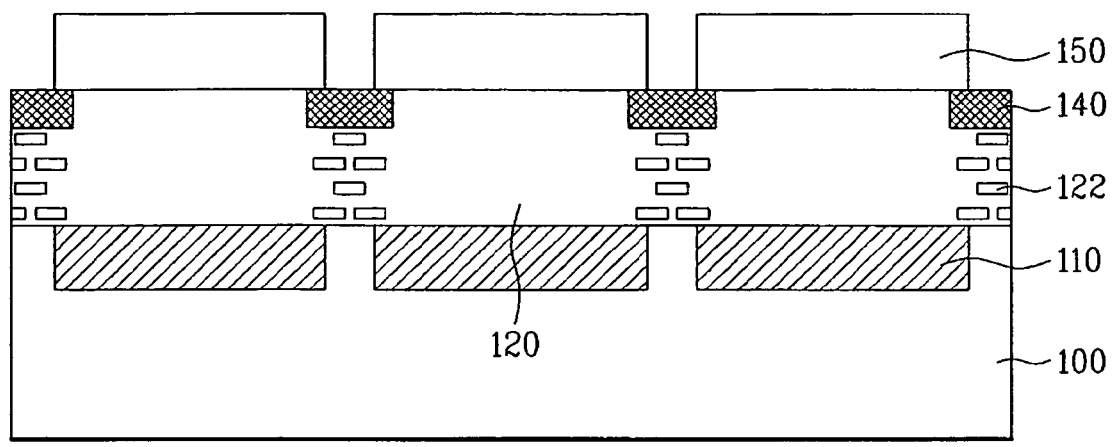

As shown in FIG. 3D, a salt resist is coated on the entire surface of the semiconductor substrate 100, including the light-shielding layers 140, and then selectively patterned by exposing and developing processes to form the color filter layers 150, which filter light at respective wavelengths, on the interlayer dielectric layer 120, including the light-shielding layers 140, at constant intervals.

The respective color filter layers 150 can be formed on the interlayer dielectric layer 120 so that both ends of each color filter layer overlap the light-shielding layers 140.

Figure 3E:
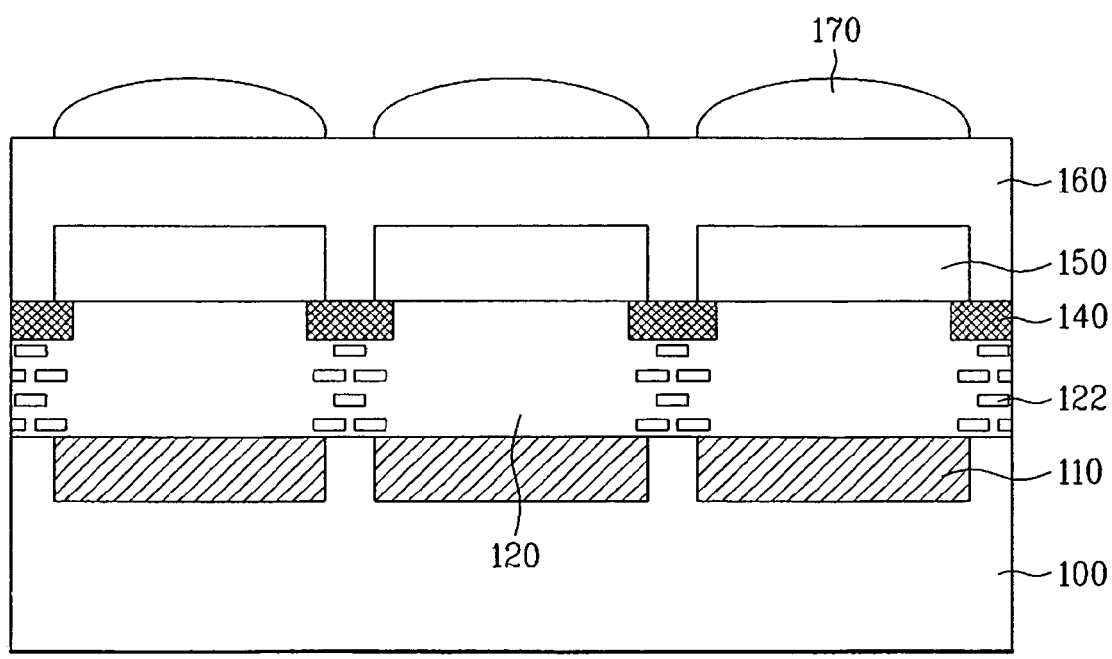

As shown in FIG. 3E, the planarization layer 160 is formed on the entire surface of the semiconductor substrate 100, including the respective color filter layers 150. A material layer for microlenses is coated on the planarization layer 160 and is then patterned by exposing and developing processes to form a microlens pattern. An oxide film such as TEOS or resist is used as the material layer for microlenses.

Next, the microlens pattern undergoes a reflow process to form the microlenses 170. As described above, the microlenses 170 can be formed on the planarization layer 160 to correspond to the portions between the respective light-shielding layers 140, thereby preventing the step difference from occurring in the light-shielding layers 140.

The reflow process may be performed using a hot plate or a furnace. At this time, the curvature of the microlenses 170 depends on the contracting and heating processes. Also, the condensing efficiency of the microlenses 170 depends on the curvature.

Finally, the microlenses 170 are hardened by irradiation of UV light so as to obtain an optimized curvature of the microlenses 170.

In an exemplary embodiment of the present invention, the light-shielding layers are used in the CMOS image sensor provided with the color filter layers. However, the light-shielding layers may be used in a vertical CMOS image sensor provided with no color filter layers. Therefore, in case where the light-shielding layers of the present invention are used in the vertical CMOS image sensor, no planarization layer formed on the color filter layers is required, and the microlenses are formed on the interlayer dielectric layer including the light-shielding layers.

As described above, the CMOS image sensor and the method for fabricating the same according to the present invention have at least the following advantages.

First, since the light-shielding layers are formed in the trenches formed in the interlayer dielectric layer, it is not necessary to form the planarization layer on the light-shielding layers. In this case, the process steps can be simplified, and the distance between the microlenses and the photodiodes can be narrowed to improve photosensitivity of the image sensor.

In addition, since the trenches for the light-shielding layers are formed simultaneously with the metal pad using the mask for the areas for the metal pad, no separate mask for the light-shielding layers is required to result in an additional simplification of process steps.

Moreover, since the light-shielding layers are formed in the trenches, it is possible to control reflectivity of light by controlling the depth of the trenches, thereby defining a narrow area regardless of resolution.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A CMOS image sensor comprising:
   a plurality of photodiodes formed in a semiconductor substrate at constant intervals;
   an interlayer dielectric layer formed on the semiconductor substrate, including the photodiodes;
   a plurality of metal lines formed in the interlayer dielectric layer;
   a plurality of light-shielding layers formed in the interlayer dielectric layer to correspond to the metal lines, wherein the light-shielding layers are formed in a plurality of trenches formed in a surface of the interlayer dielectric layer to correspond to the metal lines; and
   microlenses formed over the interlayer dielectric layer to correspond to portions between the respective light-shielding layers, thereby preventing a step difference from occurring in the light-shielding layers.

2. The CMOS image sensor as claimed in claim 1, wherein the light-shielding layers are at least one of black photoresist layers and opaque metal layers.

3. The CMOS image sensor as claimed in claim 2, wherein the opaque metal layers are Cr layers.

4. The CMOS image sensor as claimed in claim 1, wherein the photodiodes include a plurality of red photodiodes, a plurality of green photodiodes, and a plurality of blue photodiodes, the red, green, and blue photodiodes being sequentially and vertically arranged.

5. The CMOS image sensor as claimed in claim 1, further comprising color filter layers formed on the interlayer dielectric layer to correspond to the respective photodiodes.

6. The CMOS image sensor as claimed in claim 5, further comprising a planarization layer formed over the semiconductor substrate, including the color filter layers, wherein the microlenses are formed on the planarization layer to correspond to the portions between the respective light-shielding layers.

7. A method for fabricating a CMOS image sensor comprising:
   forming a plurality of photodiodes in a semiconductor substrate at constant intervals;
   forming an interlayer dielectric layer on the semiconductor substrate, including the photodiodes;
   forming a plurality of metal lines in the interlayer dielectric layer;
   forming a plurality of light-shielding layers in a surface of the interlayer dielectric layer to correspond to the metal lines; and
   forming microlenses over the interlayer dielectric layer to correspond to portions between the respective light-shielding layers, thereby preventing a step difference from occurring in the light-shielding layers.

8. The method as claimed in claim 7, wherein the step of forming the light-shielding layers includes:
   forming a plurality of trenches in the interlayer dielectric layer to correspond to the metal lines;
   forming at least one of black photoresist layers and opaque metal layers on the semiconductor substrate including the trenches; and
   planarizing the at least one of the black photoresist layers and the opaque metal layers to form the light-shielding layers in the trenches.

9. The method as claimed in claim 8, wherein the at least one of the black photoresist layers and the opaque metal layers are planarized by at least one of a chemical mechanical polishing (CMP) process and an etch-back process.

10. The method as claimed in claim 8, further comprising forming areas for the metal lines in the interlayer dielectric layer.

11. The method as claimed in claim 10, wherein the trenches are formed simultaneously with areas for a metal pad using a mask used to form the areas for the metal pad.

12. The method as claimed in claim 7, further comprising hardening the microlenses by irradiation of UV light.

13. The method as claimed in claim 7, wherein the step of forming the photodiodes includes:
   forming a plurality of red photodiodes in a first epitaxial layer grown on the semiconductor substrate;
   growing a second epitaxial layer on the first epitaxial layer, including the red photodiodes;
   forming a plurality of green photodiodes in the second epitaxial layer;
   growing a third epitaxial layer on the second epitaxial layer, including the green photodiodes; and
   forming a plurality of blue photodiodes in the third epitaxial layer.

14. The method as claimed in claim 7, further comprising forming a plurality of color filter layers on the interlayer dielectric layer to correspond to the respective photodiodes.

15. The method as claimed in claim 14, further comprising forming a planarization layer over the semiconductor substrate, including the color filter layers, wherein the microlenses are formed on the planarization layer to correspond to the portions between the respective light-shielding layers.

* * * * *